US007275833B2

(12) United States Patent
Saito

(10) Patent No.: US 7,275,833 B2
(45) Date of Patent: Oct. 2, 2007

(54) COOLING SYSTEM AND PROJECTION-TYPE IMAGE DISPLAY APPARATUS USING THE SAME

(75) Inventor: Tomonori Saito, Oume (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 223 days.

(21) Appl. No.: 11/135,813

(22) Filed: May 24, 2005

(65) Prior Publication Data
US 2005/0265001 A1  Dec. 1, 2005

(30) Foreign Application Priority Data
May 31, 2004  (JP)  ............... P 2004-162486

(51) Int. Cl.
*G03B 21/16* (2006.01)
*G03B 21/18* (2006.01)
*G03B 21/26* (2006.01)

(52) U.S. Cl. ............... 353/52; 353/57; 353/61
(58) Field of Classification Search ........... 353/52–61; 361/703, 704, 694–697
See application file for complete search history.

(56) References Cited

U.S. PATENT DOCUMENTS

| | | | |
|---|---|---|---|
| 4,712,159 A * | 12/1987 | Clemens | ............... 361/717 |
| 5,089,936 A | 2/1992 | Kojima et al. | |
| 5,168,926 A | 12/1992 | Watson | |
| 5,268,817 A | 12/1993 | Miyagawa et al. | |
| 5,594,619 A | 1/1997 | Niyagawa et al. | |
| 5,648,889 A | 7/1997 | Bosli | |
| 5,731,952 A | 3/1998 | Ohgami et al. | |
| 5,770,478 A | 6/1998 | Iruvanti et al. | |
| 5,901,035 A | 5/1999 | Foster et al. | |
| 6,005,767 A | 12/1999 | Ku et al. | |
| 6,026,888 A | 2/2000 | Moore | |
| 6,049,459 A | 4/2000 | Edmonds et al. | |
| 6,050,785 A | 4/2000 | Horng | |
| 6,141,214 A | 10/2000 | Ahn | |
| 6,148,906 A | 11/2000 | Li et al. | |
| 6,166,907 A | 12/2000 | Chien | |
| 6,196,850 B1 | 3/2001 | Dietz et al. | |
| 6,231,371 B1 | 5/2001 | Helot | |
| 6,282,082 B1 | 8/2001 | Armitage et al. | |

(Continued)

FOREIGN PATENT DOCUMENTS

EP  0834795  4/1998

(Continued)

*Primary Examiner*—Melissa Jan Koval
*Assistant Examiner*—Andrew Kong
(74) *Attorney, Agent, or Firm*—Blakely Sokoloff Taylor & Zafman LLP

(57) ABSTRACT

A cooling system for cooling a semiconductor device including a display device provided in a projection-type image display apparatus with high cooling efficiency without sacrificing cooling performance is disclosed. The cooling system includes a radiating member provided with a convex-shaped heat-receiving portion thermally connected to a heat-generating element mounted on a printed circuit board, and a supporting member provided with an opening penetrating the heat-receiving portion, and a supporting portion for supporting the radiating member. The radiating member is integrally formed of a plurality of radiating fins, a base for supporting and fixing the plurality of radiating fins at one side thereof, and the convex-shaped heat-receiving portion disposed at a bottom face of the base, and the supporting member supports the radiating member from a bottom face of the base.

21 Claims, 11 Drawing Sheets

U.S. PATENT DOCUMENTS

| | | |
|---|---|---|
| 6,288,896 B1 | 9/2001 | Hsu |
| 6,296,048 B1 | 10/2001 | Sauer |
| 6,313,990 B1 | 11/2001 | Cheon |
| 6,327,145 B1 | 12/2001 | Lian et al. |
| 6,332,758 B1 | 12/2001 | Tang et al. |
| 6,333,847 B1 | 12/2001 | Katsui et al. |
| 6,377,452 B1 | 4/2002 | Sasaki et al. |
| 6,396,687 B1 | 5/2002 | Sun et al. |
| 6,408,937 B1 | 6/2002 | Roy |
| 6,418,017 B1 | 7/2002 | Patel et al. |
| 6,430,038 B1 | 8/2002 | Helot et al. |
| 6,437,973 B1 | 8/2002 | Helot et al. |
| 6,464,195 B1 | 10/2002 | Hildebrandt |
| 6,473,296 B2 | 10/2002 | Amemiya et al. |
| 6,477,871 B1 | 11/2002 | Shaw et al. |
| 6,483,445 B1 | 11/2002 | England |
| 6,510,052 B2 | 1/2003 | Ishikawa et al. |
| 6,519,143 B1 | 2/2003 | Goko |
| 6,519,147 B2 | 2/2003 | Nakagawa et al. |
| 6,519,148 B2 | 2/2003 | Nakagawa et al. |
| 6,532,153 B1 | 3/2003 | White et al. |
| 6,570,764 B2 | 5/2003 | Bhatia et al. |
| 6,594,149 B2 | 7/2003 | Yamada et al. |
| 6,611,425 B2 | 8/2003 | Ohashi et al. |
| 6,625,022 B2 | 9/2003 | Frutschy et al. |
| 6,625,024 B2 | 9/2003 | Mermet-Guyennet |
| 6,652,223 B1 | 11/2003 | Horng et al. |
| 6,654,234 B2 | 11/2003 | Landry et al. |
| 6,656,770 B2 | 12/2003 | Atwood et al. |
| 6,668,911 B2 | 12/2003 | Bingler |
| 6,702,007 B1 | 3/2004 | Pan et al. |
| 6,717,046 B2 | 4/2004 | Yanagisawa |
| 6,717,798 B2 | 4/2004 | Bell et al. |
| 6,728,102 B2 | 4/2004 | Ishikawa et al. |
| 6,741,465 B2 | 5/2004 | Holalkere et al. |
| 6,741,470 B2 * | 5/2004 | Isenburg ..................... 361/704 |
| 6,752,204 B2 | 6/2004 | Dishongh et al. |
| 6,755,626 B2 | 6/2004 | Komatsu et al. |
| 6,757,170 B2 | 6/2004 | Lee et al. |
| 6,768,637 B1 | 7/2004 | Amemiya |
| 6,774,870 B2 | 8/2004 | Mead, Jr. et al. |
| 6,779,894 B2 * | 8/2004 | Shiraishi et al. ............... 353/57 |
| 6,785,128 B1 | 8/2004 | Yun |
| 6,804,115 B2 | 10/2004 | Lai |
| 6,808,371 B2 | 10/2004 | Niwatsukino et al. |
| 6,809,927 B2 | 10/2004 | Ohashi et al. |
| 6,809,930 B2 | 10/2004 | Mueller et al. |
| 6,829,139 B1 | 12/2004 | Duarte |
| 6,831,836 B2 | 12/2004 | Bhatia et al. |
| 6,839,234 B2 | 1/2005 | Niwatsukino et al. |
| 6,856,506 B2 | 2/2005 | Doherty et al. |
| 6,870,736 B2 | 3/2005 | Lee et al. |
| 6,873,521 B2 | 3/2005 | Landry et al. |
| 6,894,899 B2 | 5/2005 | Wu et al. |
| 6,924,978 B2 | 8/2005 | DiStefano |
| 6,927,978 B2 | 8/2005 | Arai et al. |
| 6,947,282 B2 | 9/2005 | Hotta et al. |
| 6,958,910 B2 | 10/2005 | Tanaka et al. |
| 6,983,789 B2 | 1/2006 | Jenkins et al. |
| 7,016,195 B2 | 3/2006 | Ito et al. |
| 7,054,158 B2 | 5/2006 | Kimmich |
| 7,055,581 B1 | 6/2006 | Roy |
| 7,077,189 B1 | 7/2006 | Reyzin et al. |
| 7,079,394 B2 | 7/2006 | Mok |
| 7,086,452 B1 | 8/2006 | Senyk et al. |
| 7,095,614 B2 | 8/2006 | Goldman |
| 7,124,811 B2 | 10/2006 | Crocker et al. |
| 7,143,815 B2 | 12/2006 | Lee et al. |
| 2002/0018337 A1 | 2/2002 | Nakamura |
| 2002/0053421 A1 | 5/2002 | Hisano et al. |
| 2002/0141159 A1 | 10/2002 | Bloemen |
| 2002/0192087 A1 | 12/2002 | Hsieh |
| 2003/0039097 A1 | 2/2003 | Igarashi |
| 2003/0124000 A1 | 7/2003 | Shih et al. |
| 2003/0142474 A1 | 7/2003 | Karidis et al. |
| 2003/0154598 A1 | 8/2003 | Shinotou |
| 2003/0214786 A1 | 11/2003 | Niwatsukino et al. |
| 2004/0001310 A1 | 1/2004 | Chu et al. |
| 2004/0027800 A1 | 2/2004 | Tanimoto et al. |
| 2004/0042176 A1 | 3/2004 | Niwatsukino et al. |
| 2004/0057197 A1 | 3/2004 | Hill et al. |
| 2004/0125566 A1 * | 7/2004 | Lee et al. ..................... 361/707 |
| 2005/0007739 A1 | 1/2005 | Gata |
| 2005/0052833 A1 | 3/2005 | Tanaka et al. |
| 2005/0068732 A1 | 3/2005 | Tsuji |
| 2005/0105273 A1 | 5/2005 | Tanaka et al. |
| 2005/0111190 A1 * | 5/2005 | Wang et al. ................. 361/704 |
| 2005/0117298 A1 | 6/2005 | Koga et al. |
| 2005/0164624 A1 | 7/2005 | Hisamatsu |
| 2005/0180105 A1 | 8/2005 | Matsushima et al. |

FOREIGN PATENT DOCUMENTS

| | | |
|---|---|---|
| JP | 07-049725 | 2/1995 |
| JP | 07-142886 | 6/1995 |
| JP | 08-046097 | 2/1996 |
| JP | 10-004161 | 1/1998 |
| JP | 10-055227 | 2/1998 |
| JP | 10-261884 | 9/1998 |
| JP | 10/303582 | 11/1998 |
| JP | 11-039058 | 2/1999 |
| JP | 11-166500 | 6/1999 |
| JP | 2000-049478 | 2/2000 |
| JP | 2001-057490 | 2/2001 |
| JP | 2001-230356 | 8/2001 |
| JP | 2001-251079 | 9/2001 |
| JP | 2002-099356 | 4/2002 |
| JP | 2002151638 | 5/2002 |
| JP | 2002-344186 | 11/2002 |
| JP | 2002-353670 | 12/2002 |
| JP | 2003-044169 | 2/2003 |
| JP | 2003-068317 | 3/2003 |
| JP | 2003-101272 | 4/2003 |
| JP | 2003-172286 | 6/2003 |
| JP | 2003-216278 | 7/2003 |
| JP | 3431024 | 7/2003 |
| JP | 2003-233441 | 8/2003 |
| JP | 3452059 | 9/2003 |
| JP | 2003-343492 | 12/2003 |
| JP | 2004-047921 | 2/2004 |

* cited by examiner

COOLING SYSTEM AND PROJECTION-TYPE IMAGE DISPLAY APPARATUS USING THE SAME

CROSS-REFERENCE TO RELATED APPLICATIONS

This application claims the benefit of priority of Japanese Patent Application No. 2004-162486, filed May 31, 2004, the entire contents of which are incorporated herein by reference.

BACKGROUND

1. Field

The present invention relates to a cooling system for cooling a heat-generating unit, and more particularly relates to a cooling system for cooling a semiconductor device mounted on a printed circuit board, and to a projection-type image display apparatus using the same.

2. Description of the Related Art

Recently, the amount of heat released from semiconductor devices mounted on printed circuit boards has been increasing, and a technology for cooling the semiconductor devices has become more and more important.

In particular, the processing clock speed of CPUs for use in information processing devices, such as personal computers, etc., has been rapidly moving toward higher frequencies in recent years so as to realize faster processing speeds.

Along with the higher frequency trend of the processing clock of CPUs, the amount of heat released from CPUs is rapidly increasing, and a technology for cooling CPUs has become indispensable to maintain CPU performance.

In many cases, to cool a CPU, a method is employed in which a radiator (sometimes called a heat sink) provided with numerous radiating fins or numerous radiating projections is thermally connected to a heat-generating portion of the CPU, and the radiator is forcibly air-cooled.

When the radiator is attached to the CPU, a mechanical connection between the radiator and the CPU has to be maintained even when vibration or a shock is applied thereto, while the heat transfer performance between the radiator and the heat-generating portion of the CPU has to be secured.

In addition, in recent years, there is a trend in key electronic devices, such as CPUs and the like toward an easily exchangeable method using a socket or the like, instead of the method of directly fixing the electronic device to a printed circuit board with a soldered connection. In response to the above-mentioned trend, an easy method for attaching the radiator to the CPU or detaching the radiator from the CPU is required.

Technologies for securing a thermal connection and a mechanical connection for the semiconductor device, for example, connecting a CPU and the like with a radiator, in which both the semiconductor device and CPU and the like can easily be attached and detached, are disclosed in Jpn Pat. Publication No. 2001-230356, Jpn Pat. Publication No. 10-4161, and Jpn pat. Publication No. 8-46097.

However, the main technologies disclosed in all of these documents use a method in which the radiator is fixed by using an appropriate member from above.

For example, in the technology disclosed in Jpn Pat. Publication No. 2001-230356, a radiator is placed on a CPU that is attached to a socket provided on a printed circuit board, and is fixed to the CPU by downwardly pressing the radiator and the CPU toward the socket with metal wire rods having elasticity in engagement with two positions of the socket.

A concave portion is provided at the center of the radiating fins of the radiator, so as to prevent the metal wire rods from deviating at an upper part of the radiator.

Even though the mechanical connection and the thermal connection of the CPU with the radiator are secured by the above-mentioned configuration, radiating performance is sacrificed. This is because the concave portion is formed at the center of the radiating fins and the radiating area of the radiating fins is thereby reduced.

In Jpn Pat. Publication No. 10-4161, a technology for fixing the radiator and the CPU from above the radiator using metal wire rods having elasticity or a plate spring is disclosed, like that disclosed in Jpn Pat. Publication No. 2001-230356. The radiator disclosed in Jpn Pat. Publication No. 10-4161 is provided with numerous radiating projections, and the metal wire rods and the plate spring are provided for pressing the radiator and the CPU downward fitting into the predetermined clearance of the numerous radiating projections.

The shape of a radiating portion described in Jpn Pat. Publication No. 10-4161 is limited to a projecting shape, and an embodiment describing a radiator provided with plate-shaped radiating fins is not disclosed therein. In addition, in the case of forcibly air-cooling the radiator, the air resistance of a flowing path for air is expected to be increased due to attached members, such as the metal wire rods, the plate spring, and the like.

In Jpn Pat. Publication No. 8-46097, a technology for fixing the CPU and the radiator by pressing down a plate-shaped member from above is disclosed. In this technology, the CPU is covered with the radiator, and the plate-shaped member further covers the radiator from above.

Even in the technology disclosed in Jpn Pat. Publication No. 8-46097, the radiating area of the radiating portion is partially sacrificed by a boss portion and the like for fixing the radiator and the plate-shaped member.

Thus, all of the cooling systems disclosed in the above-mentioned patent applications use a method to fix the radiator with the CPU from above, and therefore, the cooling system is configured such that some of the cooling performance is sacrificed due to a decrease of the radiating area, or an increase of the air resistance of the flowing path due to the provision of the fixing members.

On the other hand, semiconductor devices that require forcible cooling are not limited to the technical field of information processing apparatuses.

In the technical field of a projection-type image display apparatus, a key electronic device, which is called a display device, is required to be cooled to the same extent as CPUs, or even greater.

Display devices include a transmissive liquid crystal display devices and reflective liquid crystal display devices, and the projection-type image display apparatus using the liquid crystal display device is sometimes called a liquid crystal projector.

A DMD (Digital Micro-Mirror Device: trademark) is a known display device other than those described above, and a projection-type image display apparatus using the DMD is called a DLP (Digital Light Processing: trademark) type projector.

The DMD is a reflection-type display device formed of microscopic mirrors on a surface thereof that correspond in number with pixels, and light falling on a surface of the DMD is modulated and reflected by electronically and mechanically changing an angle of each of the mirrors.

Both DMD (trademark) and DLP (trademark) are trademarks of Texas Instruments in the United States of America.

Both the above-mentioned liquid crystal display and DMD control image signals pixel by pixel using a semiconductor element and heat is generated by the semiconductor element itself.

Further, the above-mentioned display devices project reflection light or transmission light onto a screen by reflecting or transmitting light from a light source that is housed in the projection-type image display apparatus. When the light is projected, a certain reflection loss or transmission loss occurs in the display device, and as a result, some of the light energy is converted into heat energy.

Therefore, in the liquid crystal display device and the display devices such as the DMD and the like, heat generation caused by the reflection loss and the transmission loss is added to the heat generation caused by the semiconductor element itself.

SUMMARY OF THE INVENTION

The present invention is made in light of the above described circumstances, and an object of the present invention is to provide a cooling system capable of cooling a semiconductor device, including a display device, for use in a projection-type image display device with high cooling efficiency.

Accordingly, in one aspect, the present invention provides a cooling system including a radiating member provided with a convex-shaped heat-receiving portion thermally connected to a heat-generating element mounted on a printed circuit board, a supporting member provided with an opening penetrating the heat-receiving portion, and a supporting portion for supporting the radiating member. The radiating member is integrally formed of a plurality of radiating fins, a base for supporting and fixing the plurality of radiating fins at one side thereof, and the convex-shaped heat-receiving portion disposed at a bottom face of the base, in which the supporting member supports the radiating member from the bottom face of the base.

According to another aspect, the present invention provides a cooling system including a fixing member having a light opening for passing light from a light source, a display device provided with a reflecting face facing the light opening and reflecting the light, a printed circuit board on which the display device is mounted, a radiating member provided with a convex-shaped heat-receiving portion thermally connected to a heat-generating face of the display device, and a supporting member provided with an opening penetrating the heat-receiving portion and a supporting portion for supporting the radiating member, in which the radiating member is integrally formed of a plurality of radiating fins, a base for supporting and fixing the plurality of radiating fins at one side thereof, and the convex-shaped heat-receiving portion disposed at a bottom face of the base, and in which the supporting member supports the radiating member from a bottom face of the base.

In still another aspect, the present invention provides a projection-type image display apparatus including a light source for generating light, a projection lens unit for projecting an image onto a screen provided outside, a fixing member having a light opening portion for passing the light from the light source, a display device provided with a reflection face facing the light opening portion and reflecting the light, a printed circuit board on which the display device is mounted, a radiating member provided with a convex-shaped heat-receiving portion thermally connected to a heat-generating face of the display device, and a supporting member provided with a supporting portion for supporting the radiating member and an opening portion penetrating the heat-receiving portion, in which the radiating member is integrally formed of a plurality of radiating fins, a base for supporting and fixing the plurality of radiating fins at one side thereof, and the convex-shaped heat-receiving portion disposed at a bottom face of the base, and in which the supporting member supports the radiating member from a bottom face of the base.

According to the cooling system of the present invention, the cooling system is capable of cooling a semiconductor device, including a display device, provided in the projection-type image display device with high cooling efficiency without sacrificing cooling performance.

Further, according to the projection-type image display apparatus provided with the cooling system of the present invention, the cooling system is capable of cooling the reflection-type display device with high cooling efficiency without sacrificing cooling performance.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Referring now to the accompanying drawings, a first embodiment of a cooling system and a projection-type image display apparatus according to the present invention will be explained below in detail.

(1) Overall Configuration of the Projection-Type Image Display Apparatus

The projection-type image display apparatus 1 is provided with, for example, an ultrahigh-pressure mercury lamp that serves as a light source. Light from the light source falls on a display device called a DMD (Digital Micro-Mirror Device) through a rotating film (a color wheel) composed of three color films of red, green, and blue (RGB). Then, the light is reflected by the DMD after being modulated pixel by pixel, and is enlarged and projected onto a screen through a projection lens.

Figure 1A:
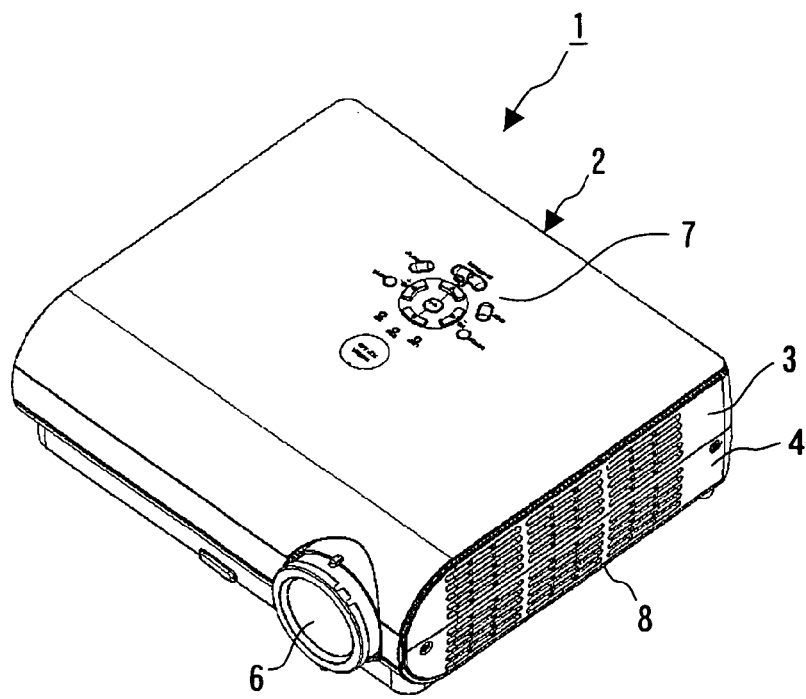
FIG. 1A is an exemplary perspective view illustrating a projection-type image display apparatus according to one embodiment of the present invention, looking from above.
Figure 1B:
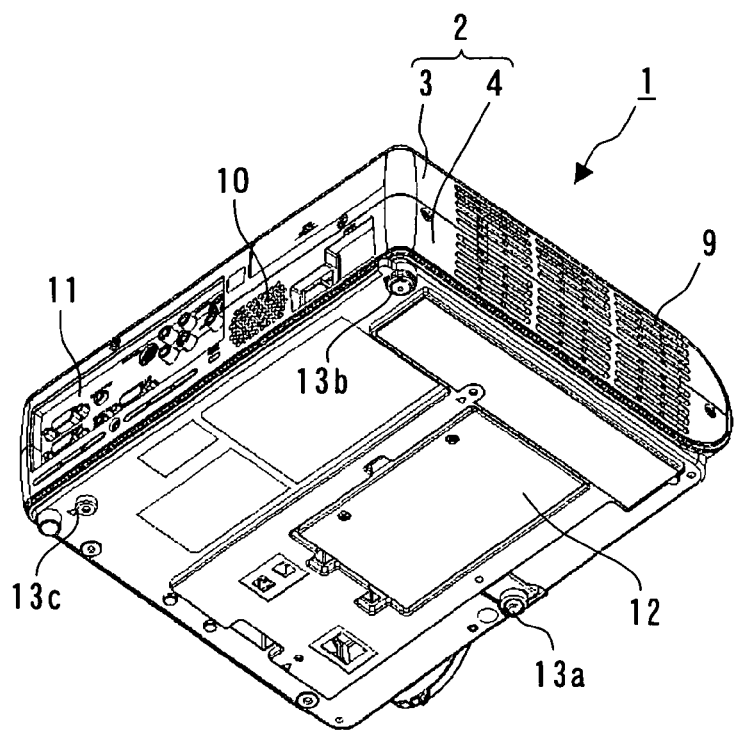
FIG. 1B is an exemplary perspective view illustrating the projection-type image display apparatus according to one embodiment of the present invention, looking from below.

FIGS. 1A and 1B illustrate an example of an external view of the projection-type image display apparatus 1. FIG. 1A is an exemplary perspective view illustrating the projection-type image display apparatus 1, looking from above, and FIG. 1B is an exemplary perspective view illustrating the projection-type image display apparatus 1, looking from below.

As illustrated in FIGS. 1A and 1B, the projection-type image display apparatus 1 is provided with a main body case 2 configured so that it can be divided into two parts, namely, an upper part and a lower part thereof, and part of a projection-lens unit 6 is exposed at a front face of the main body case 2. Each of the components of the projection-type image display apparatus 1 is housed in the main body case 2.

The main body case 2 is composed of an upper case 3 and a lower case 4.

As illustrated in FIG. 1A, part of the projection-lens unit 6 for projecting the enlarged image onto an outside screen is exposed at the front face of the main body case 2.

Further, numerous suction inlets 8 for sucking cooling air are disposed at a left side, looking from a back face of the upper case 3 and the lower case 4.

A plurality of operation buttons 7 are disposed at an upper surface of the upper case 3 so as to perform various kinds of operation of the projection-type image display apparatus 1.

As illustrated in FIG. 1B, numerous exhaust outlets 9 for exhausting the cooling air are disposed at a right side, looking from the back face of the upper case 3 and lower case 4.

Numerous continuous holes 10 are provided at a lower part of the back face of the main body case 2. The continuous holes 10 are used for outputting sound from a speaker disposed inside the main body case 2.

Further, a connecter panel 11 for disposing various kinds of connecters that are connected to external devices, such as a TV receiver, a personal computer, and the like, is provided at the back face of the main body case 2.

A door 12 for replacing a lamp that serves as a light source is provided at a bottom face of the lower case 4. In addition, a foot 13a, a foot 13b, and a foot 13c for supporting the projection-type image display apparatus 1 at three points are also provided at a bottom face of the lower case 4.

(2) Layout of the Components of the Projection-Type Image Display Apparatus

Figure 2:
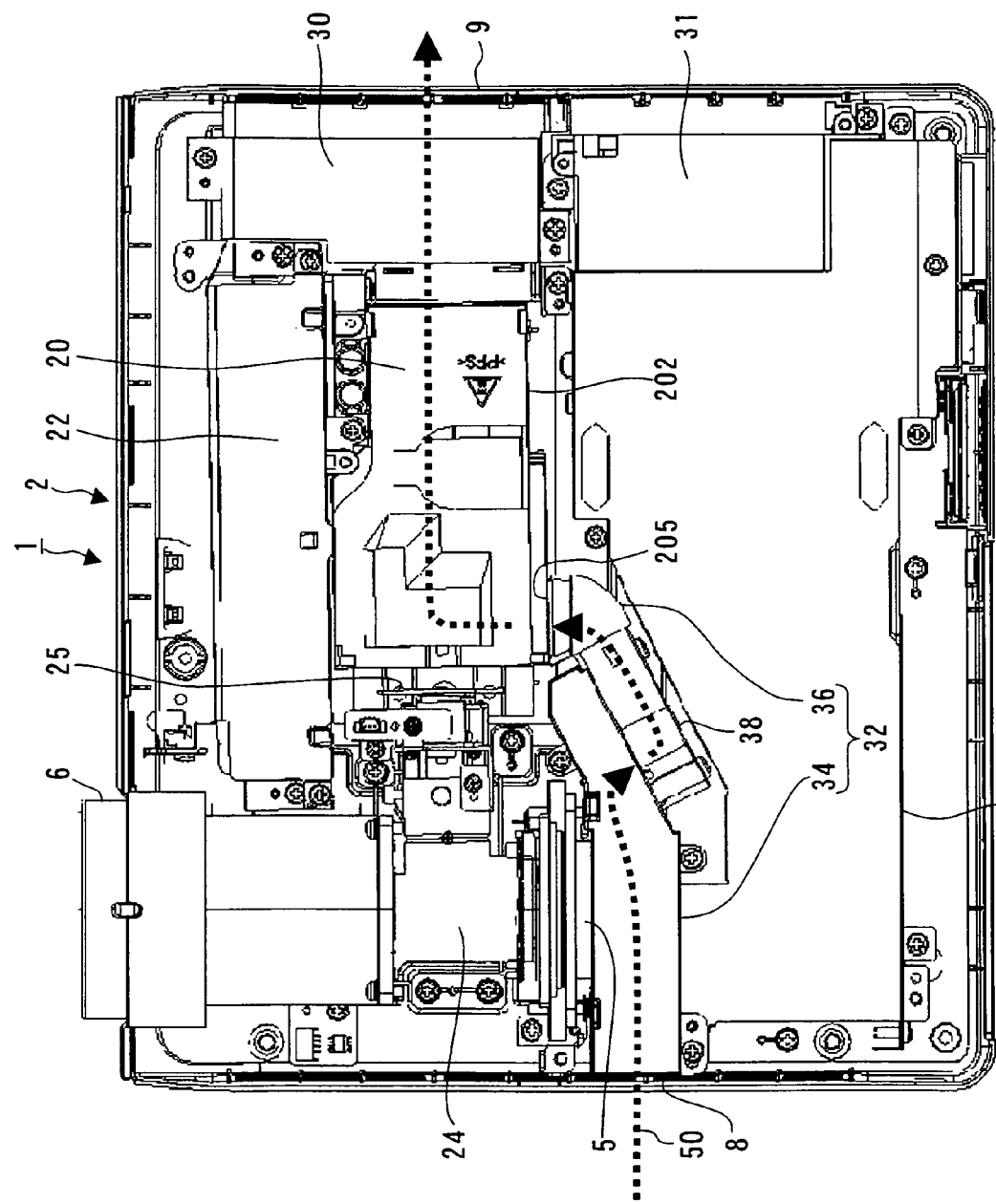
FIG. 2 is a plan view illustrating a layout of each of the components housed in the projection-type image display apparatus.

FIG. 2 is a plan view illustrating the layout of each of the components housed in the projection-type image display apparatus 1, looking from above, when the upper case 3 that composes the main body case 2 is removed.

The projection-lens unit 6 is disposed at the left side in front of the main body case 2 in FIG. 2. The image is enlarged and projected by the light irradiated from the projection-lens unit 6, onto the screen (not shown) located in front of the projection-lens unit 6.

In close proximity to the center of the main body case 2, a light unit 20 that houses the lamp that serves as the light source is disposed. At a left side of the light unit 20 in FIG. 2, an optical unit 24 is disposed in contact with a back portion of the projection-lens unit 6. The optical unit 24 is provided for optically changing the direction of a beam of light coming from the light unit 20.

The color wheel 25 is disposed between the light unit 20 and the optical unit 24. The color wheel 25 is a rotating disk provided with transparent films of three primary colors of red, green, and blue, which is used for colorizing white light from the light source.

A light source power supply 22 for supplying a light source lamp 201 with power is disposed between the light unit 20 and a front side face of the main body case 2.

Further, an exhaust fan 30 for exhausting the cooling air outside the main body case 2 is disposed between the light unit 20 and the exhaust outlet 9.

A main circuit block 28 is disposed in a space in a rear side half, which occupies about one half of the space in the main body case 2.

The main circuit block 28 is composed of a printed circuit board disposed in parallel with a bottom face of the main body case 2, electronic parts mounted on the printed circuit board, a circuit power supply section (not shown) for supplying power to fans for exhausting and sucking the cooling air, and the like.

Furthermore, an exhaust fan 31 for the main circuit block 28 is disposed between the main circuit block 28 and a right side face of the main body case 2.

An air duct 32 is disposed across the center part and a left side face of the main body case 2. One end of the air duct 32 faces and neighbors the suction inlet 8 disposed at left side face of the main body case 2. The other end of the air duct 32 is connected to the light unit 20.

The air duct 32 is composed of a suction-side duct 34 and an exhaust-side duct 36 having a sector-shape section, as shown in FIG. 2. A suction fan 38 is disposed between the suction-side duct 34 and the exhaust-side duct 36 and is connected to each of the suction-side duct 34 and the exhaust-side duct 36.

A reflection-type display device 26 and a cooling system 5 for cooling heat generated by the reflection-type display device 26 are disposed between the optical unit 24 and the suction-side duct 34.

The reflection-type display device 26 is composed of an electronic device, such as, for example, a DMD (Digital Micro-Mirror Device). The DMD is formed of microscopic mirrors on a surface of the display device, corresponding in number with pixels. The angle of individual microscopic mirrors is electronically and mechanically changed at high speed, and the light falling on a surface of the DMD is thereby modulated and reflected so as to form an image.

A radiating fins 401 of a radiating member 40 that composes the cooling system 5 is housed in the suction-side duct 34 (as shown in FIG. 5, etc.).

Next, the function of the optical system in the projection-type image display apparatus 1 is schematically explained.

White light emitted by the lamp that serves as the light source housed in the light unit 20 is irradiated from a left side face of the light unit 20 in FIG. 2. The white light is changed to primary color light of red, green, and blue after passing through the color wheel 25 and falls on the optical unit 24.

The beam of light falling on the optical unit 24 is directed to the reflection-type display device 26, after having its direction changed at the optical unit 24. A reflection face of the reflection-type display device 26 faces a front side, i.e., the direction of the projection-lens unit 6. The beam of the light reflected by the reflection face of the reflection-type display device 26 travels in a straight line through the inside of the optical unit 24 and falls on the projection-lens unit 6.

In the projection-lens unit 6, an irradiation angle of the beam of the light is enlarged by a lens group having a focus adjusting mechanism and the like, and the enlarged image is projected onto the outside screen. Thus, the image formed on the reflection-type display device 26 is enlarged and displayed onto the outside screen.

(3) Flow of the Cooling Air for Cooling the Reflection-Type Display Device

An air flow path 50 illustrated in FIG. 2 represents a path where the air sucked from the suction inlet 8 travels through the suction-side duct 34, the suction fan 38, the exhaust-side duct 36, and the light unit 20, and then flows outside from the exhaust outlets 9 via the exhaust fan 30.

In the air flow path 50, the reflection-type display device 26 that is thermally connected to the radiating fins 401 is cooled by exchanging heat with the radiating fins 401 housed inside the suction-side duct 34. In addition, in the air flow path 50, the light source lamp 201 is also cooled by the cooling air to which pressure is applied by the suction fan 38 to flow through the inside of the light unit 20.

Thus, the air flow path 50 serves as a cooling air flow path that is specifically designed to cool the reflection-type display device 26 and the light source lamp 201.

(4) Mounting of the Cooling System

Figure 3:
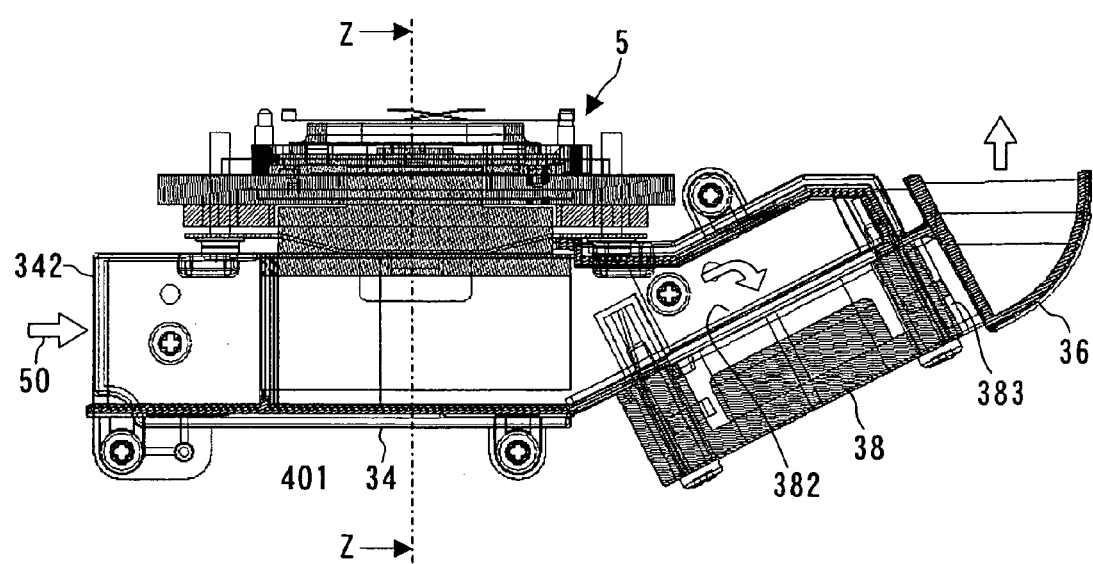
FIG. 3 is a cross-section illustrating a cooling system mounted on an air duct according to a first embodiment of the present invention, looking from above.

FIG. 3 is a cross-section illustrating the suction-side duct 34, the suction fan 38, and the exhaust-side duct 36 provided in the projection-type image display apparatus 1, in which the cooling system 5 is mounted, looking from above the projection-type image display apparatus 1.

Ambient air that serves as the cooling air is sucked by the suction fan 38, which is driven by a motor, disposed at an intermediate position between the suction-side duct 34 and the exhaust-side duct 36, from the suction inlet 8 provided in the main body case 2, and the cooling air is exhausted from the exhaust-side duct 36.

The exhaust-side duct 36 is communicated with a light case inlet opening 205 (as shown in FIG. 2) provided in a light case 202 of the light unit 20, and the air exhausted from the exhaust-side duct 36 thereby flows through the inside of the light case 202.

The ambient air sucked into a suction opening 342 of the suction-side duct 34 cools the radiating fins 401 of the radiating member 40 housed in the suction-side duct 34, while flowing through the suction-side duct 34 toward the suction fan 38. The radiating fins 401 is housed in the suction-side duct 34 in such a manner that most of the space inside the suction-side duct 34 is occupied by numerous radiating fins 401, so as to obtain a large heat exchange area of the radiating fins 401.

The cooling air that has cooled the radiating fins 401 is sucked from a suction inlet 382 of the suction fan 38, and the pressure for the cooling air to flow is applied by the suction fan 38. Thereafter, the air is exhausted from a fan exhaust outlet 383 toward the exhaust-side duct 36.

Figure 4:
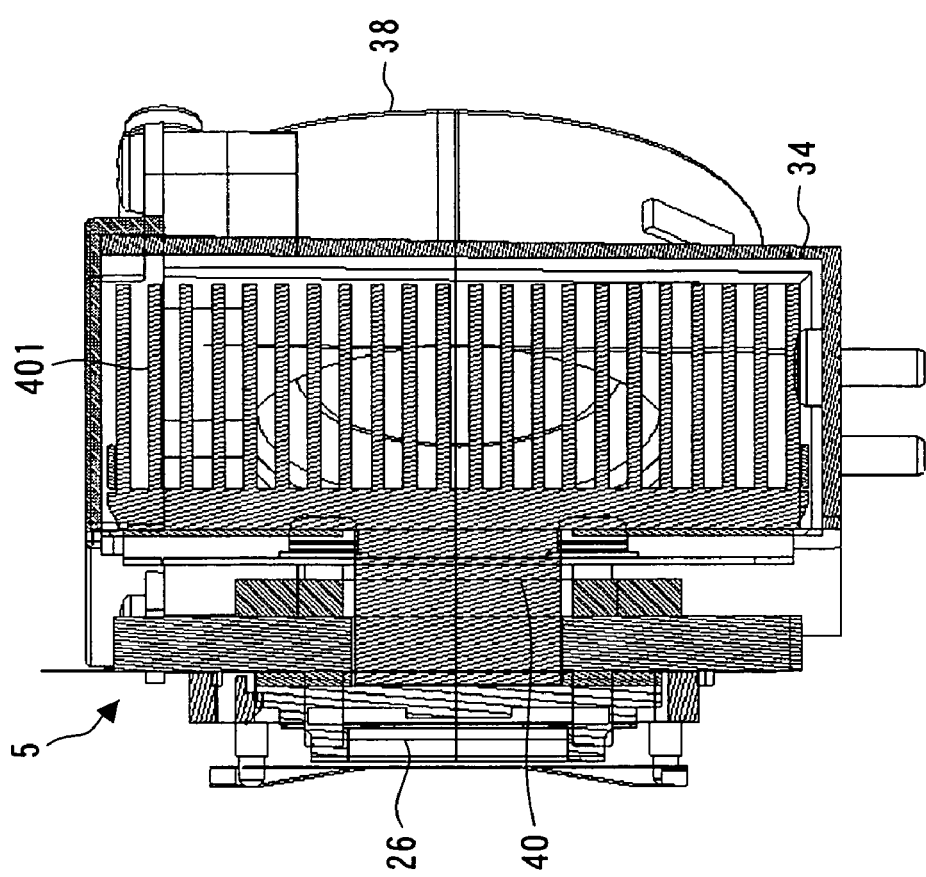
FIG. 4 is a cross-section of FIG. 3, looking from the direction of arrows Z-Z.

FIG. 4 is a cross-section of FIG. 3, looking from the direction of arrows Z-Z. As illustrated in FIG. 4, the numerous radiating fins 401 provided in the radiating member 40 are housed in the suction-side duct 34 in such a manner that most of the space inside the suction-side duct 34 is occupied by the numerous radiating fins 401, so as to obtain a large heat exchange area of the radiating fins 401. By being configured in this way, the heat exchange area is increased and approximately all the cooling air flowing through an inside of the suction-side duct 34 becomes capable of contacting a surface of the radiating fins 401. Therefore, the radiating fins 401 can be cooled efficiently.

As a result, a heat-generating face 26b of the reflection-type display device 26 that is thermally connected to a heat-receiving portion 402 of the radiating member 40 can be cooled efficiently.

Figure 5A:
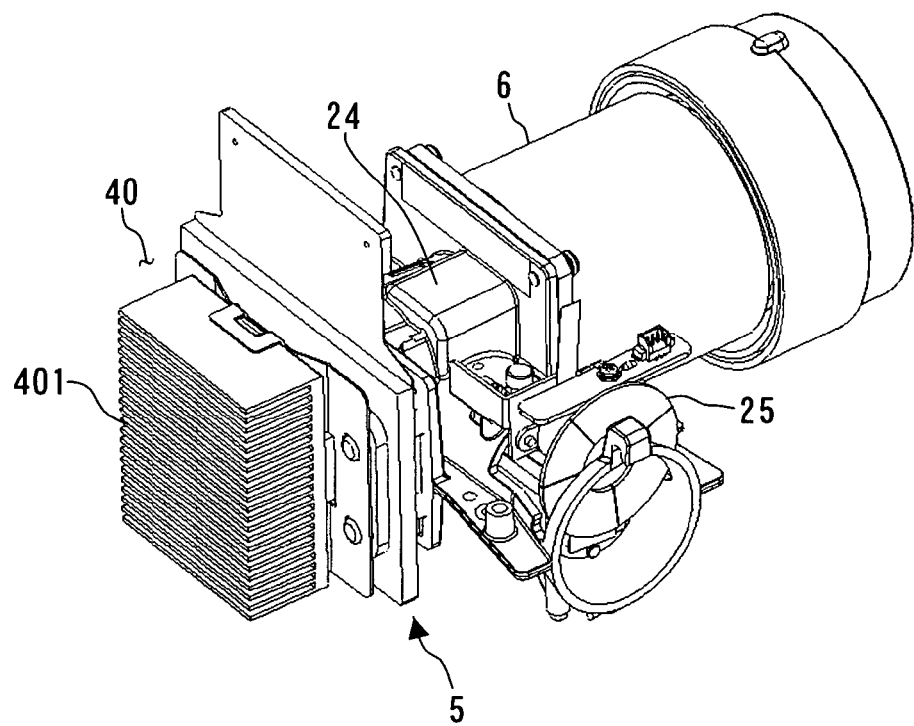
FIG. 5A is a first perspective view illustrating the cooling system mounted on components of an optical system according to a first embodiment of the present invention.
Figure 5B:
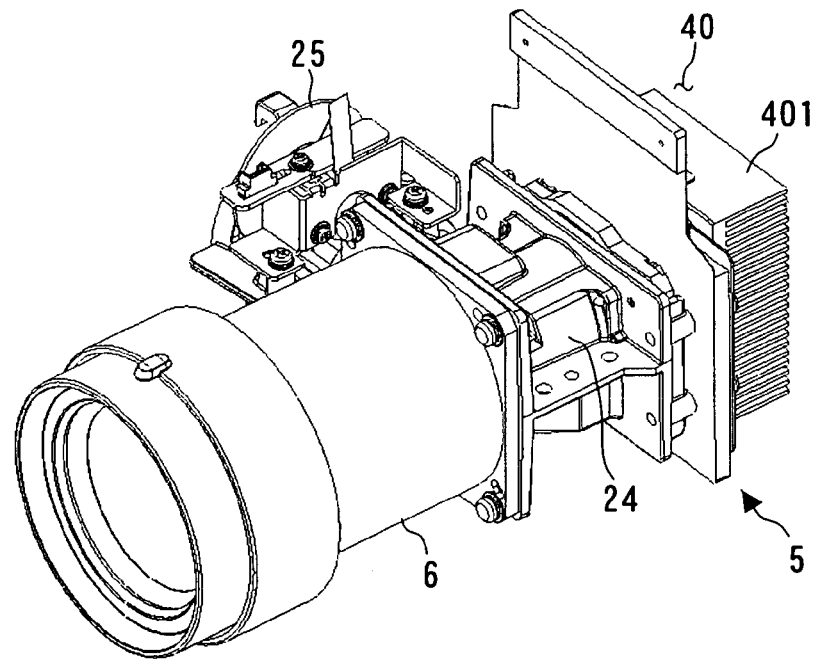
FIG. 5B is a second perspective view illustrating the cooling system mounted on the components of the optical system according to the first embodiment of the present invention.

FIGS. 5A and 5B illustrate a mounted state in which the cooling system 5 is combined with each of the components of the optical system. FIG. 5A is a perspective view illustrating the projection-type image display apparatus 1, looking from a backside thereof, and FIG. 5B is a perspective view illustrating the projection-type image display apparatus 1, looking from a front side thereof.

The cooling system 5 is fixed to the optical unit 24 by screws from the rear side of the optical unit 24. The projection-lens unit 6 is fixed to a front face side of the optical unit 24.

The light unit 20 is disposed at a right side of the optical unit 24 in FIG. 2. The white light irradiated from the light unit 20 is converted into each of the three primary colors of red, green, and blue by the color wheel 25 and falls on the optical unit 24.

The direction of the beam of the light is changed inside the optical unit 24 and is directed towards the reflection-type display device 26 provided with the cooling system 5. Image light that is modulated and reflected by the reflection-type display device 26 travels in a straight line through the inside of the optical unit 24 and falls on the projection-lens unit 6. Thereafter, the image light of the enlarged image is projected onto the screen provided in front of the projection-type image display apparatus 1.

In the components of the cooling system 5 illustrated in FIG. 5A, the radiating fins 401 of the radiating member 40 is housed inside the exhaust-side duct 36.

(5) Configuration of the Cooling System

Figure 6A:
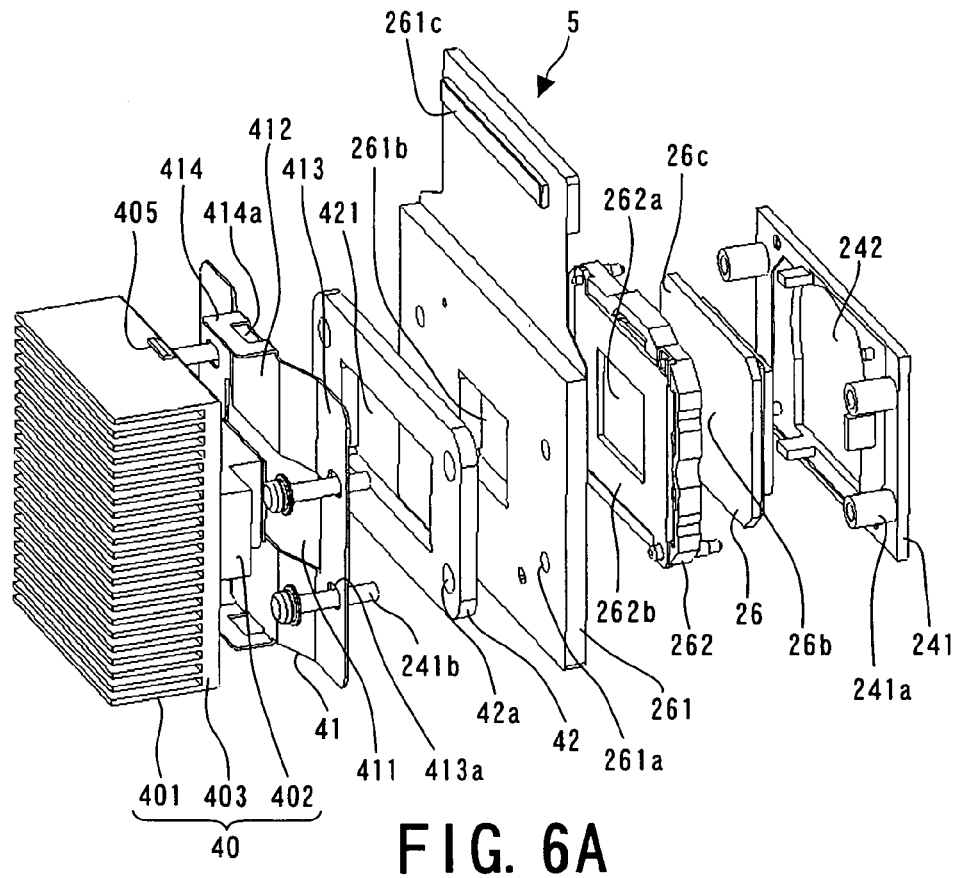
FIG. 6A is a first exploded view illustrating a structure of the cooling system according to the first embodiment of the present invention.
Figure 6B:
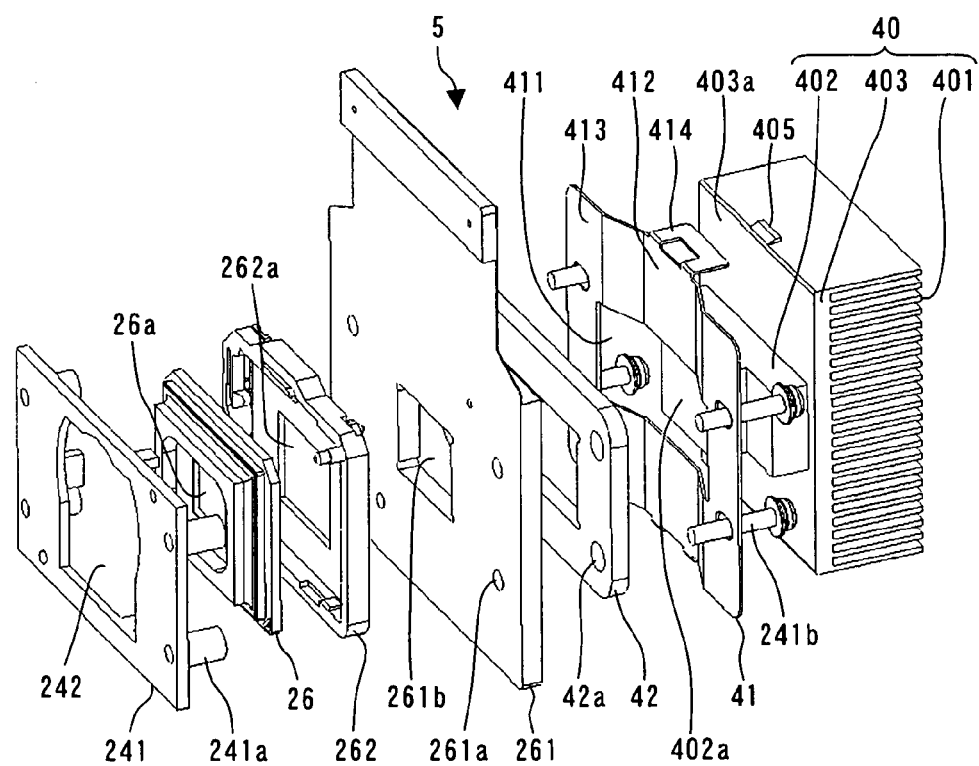
FIG. 6B is a second exploded view illustrating the structure of the cooling system according to the first embodiment of the present invention.

FIGS. 6A and 6B illustrate the configuration and structure of the cooling system 5 provided in the projection-type image display apparatus 1 in an exploded perspective view. FIGS. 6A and 6B illustrate the same configuration of the cooling system 5 and structure from different viewing angles.

As illustrated in FIG. 6A, the cooling system 5 includes the radiating member 40 provided with a plurality of plate-shaped radiating fins 401, a supporting member 41 supporting the radiating member 40, the reflection-type display device 26 that serves as a heat-generating element, a DMD case 262 that facilitates mounting of the reflection-type display device 26, a printed circuit board 261 on which the reflection-type display device 26 is mounted, a reinforcing plate 42 that prevents the printed circuit board 261 from receiving excessive stress, and a fixing member 241 that attaches and fixes each of the components.

The radiating member 40 is integrally formed of the numerous plate-shaped radiating fins 401, a base 403 that supports and fixes the numerous radiating fins 401 from one side, and the heat-receiving portion 402 having two-stepped convex-shaped projections from a bottom face 403*a* of the base 403. The radiating member 40 is formed of metal having a high thermal conductivity, such as aluminum and the like.

The reflection-type display device 26 has an approximately rectangular shape, as shown in FIG. 6B and a rectangular concave portion is formed in the center at a front surface side (a face that faces the fixing member 241). A bottom face of the concave portion serves as a reflecting face 26*a* that is composed of numerous microscopic mirrors (micro-mirrors) that correspond in number with pixels.

The light from the light source falls on the reflecting face 26*a* after passing through an optical opening 242 provided in the fixing member 241, and the light reflected by the micro-mirror of the reflecting face 26*a* is directed towards the projection-lens unit 6, also after passing through the optical opening 242.

The reflection-type display device 26 that serves as the DMD (Digital Micro-Mirror Device: trademark) houses a semiconductor element for controlling the micro-mirrors, and the semiconductor element generates heat. Further, not all the light falling on the reflection-type display device 26 is reflected; some of the light is converted into heat energy and constitutes a reflection loss. Thus, the reflection-type display device 26 generates heat due to both heat generation caused by the semiconductor element and heat generation caused by incident light.

The heat generated by the reflection-type display device 26 is transferred from the inside to a heat-generating face 26*b* (in FIG. 6A) that is made of metal, which is provided at the rear side of the reflection-type display device 26.

The reflection-type display device 26 is cooled by exchanging the heat that is transferred from the heat-generating face 26*b* with the cooling air applied by the radiating fins 401 of the radiating member 40.

Numerous pins (not shown) for electrical interface of the reflection-type display device 26 are exposed in a connecting face 26*c* disposed around the heat-generating face 26*b*.

The DMD case 262 facilitates mounting of the reflection-type display device 26 onto the printed circuit board 261. The DMD case 262 is provided with an opening at the center thereof to allow penetration of the heat-receiving portion 402 of the radiating member 40, and is made of, for example, synthetic resin, or the like.

Accurate positioning of the reflection-type display device 26 and the printed circuit board 261 can be performed by the DMD case 262.

In addition, the DMD case 262 is provided with numerous pins (not shown) having elasticity that penetrate both the front face and the back face thereof, and thereby, the reflection-type display device 26 and the printed circuit board 261 can electrically be connected by pressing the reflection-type display device 26 toward the printed circuit board 261 sandwiching the DMD case 262 in between, without soldering work.

The reflection-type display device 26 is mounted onto the printed circuit board 261 via the DMD case 262. In the center of the printed circuit board 261, an opening 261*b* is provided to allow penetration of the heat-receiving portion 402 of the radiating member 40. An electrical signal path for the reflection-type display device 26 is connected to the printed circuit board 261 via the DMD case 262 and further is electrically connected to the outside circuit via a connector 261*c*.

The reinforcing plate 42 is disposed between the printed circuit board 261 and the supporting member 41 to prevent the printed circuit board 261 from receiving excessive stress when the cooling system 5 is assembled by fixing with screws.

The supporting member 41 is provided for supporting the radiating member 40 from the bottom face 403*a* side of the base 403, and for pressing a heat-receiving face 402*a* of the heat-receiving portion 402 provided in the supported radiating member 40 toward the heat-generating face 26*b* of the reflection-type display device 26 with an appropriate pressure.

The supporting member 41 is formed of a plate-shaped member having an opening 411 at the center thereof, through which the heat-receiving face 402*a* of the heat-receiving portion 402 penetrates.

Further, the supporting member 41 is provided with a supporting portion 412 projecting upwards toward the radiating member 40 side, an attaching portion 413 provided at both sides of the supporting portion 412, and a latching portion 414 provided at both an upper end and a lower end of the supporting member 41 shown in FIG. 6.

The supporting member 41 is formed by press work with plate-shaped material having appropriate elasticity, such as, for example, a stainless steel plate, or the like. The material for the supporting member 41 is not limited to metal but a synthetic resin plate having appropriate elasticity (for example) may be used.

The latching portion 414 of the supporting member 41 is fixed to the radiating member 40 by latching a latching hole 414*a* provided at the latching portion 414 to a latching projection 405 provided at both ends of the base 403 of the radiating member 40 (hereinafter, this operation is referred to as latching engagement).

The supporting portion 412 of the supporting member 41 supports the radiating member 40 from the bottom face 403*a* side of the base 403.

Furthermore, the attaching portion 413 of the supporting member 41 is provided with four screw guide holes to allow penetration of fixing screws 241*b* therethrough.

The fixing member 241 is one of the components of the cooling system 5 and serves as a part of a side wall of a rear side of the optical unit 24 in FIG. 5A.

The fixing member 241 is provided with the optical opening 242 at the center thereof, and the light from the light source falls on the reflection-type display device 26 through the optical opening 242, and the light is then reflected by the reflection-type display device 26. Then, the light reflected by the reflection-type display device 26 is directed toward the projection-lens unit 6 through the optical opening 242 again.

At four corners of the fixing member 241, boss portions 241a are provided for assembling the cooling system 5 with the fixing screws 241b.

(6) Assembling Process for the Cooling System 5

The radiating member 40 is combined with the supporting member 41 by latching the latching portion 414 of the supporting member 41 with the latching projection 405 of the radiating member 40 and the supporting portion 412 of the supporting member 41 supports the bottom face 403a of the base 403 of the radiating member 40, as illustrated in FIG. 6A.

On the other hand, the four fixing screws 241b are screwed into screw holes of the four boss portions 241a provided in the fixing member 241 penetrating through the screw guide holes 413a, 42a, and 261a, which are provided in the supporting member 41, the reinforcing plate 42, and the printed circuit board 261, respectively.

By being screwed in the manner as described above, the supporting member 41 and the fixing member 241, and the reinforcing plate 42, printed circuit board 261, the DMD case 262, and the reflection-type display device 26, each of which is sandwiched between the supporting member 41 and the fixing member 241 are assembled into a single body.

(7) Detailed Structure of the Cooling System 5

Figure 7A:
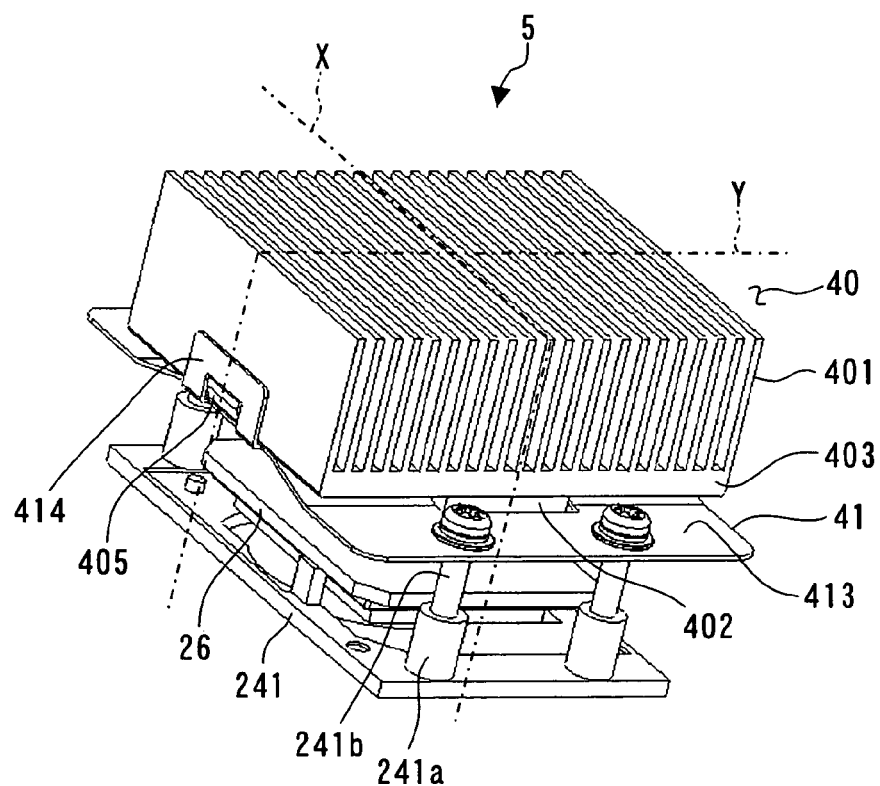
FIG. 7A is a first perspective view illustrating the cooling system according to the first embodiment of the present invention.
Figure 7B:
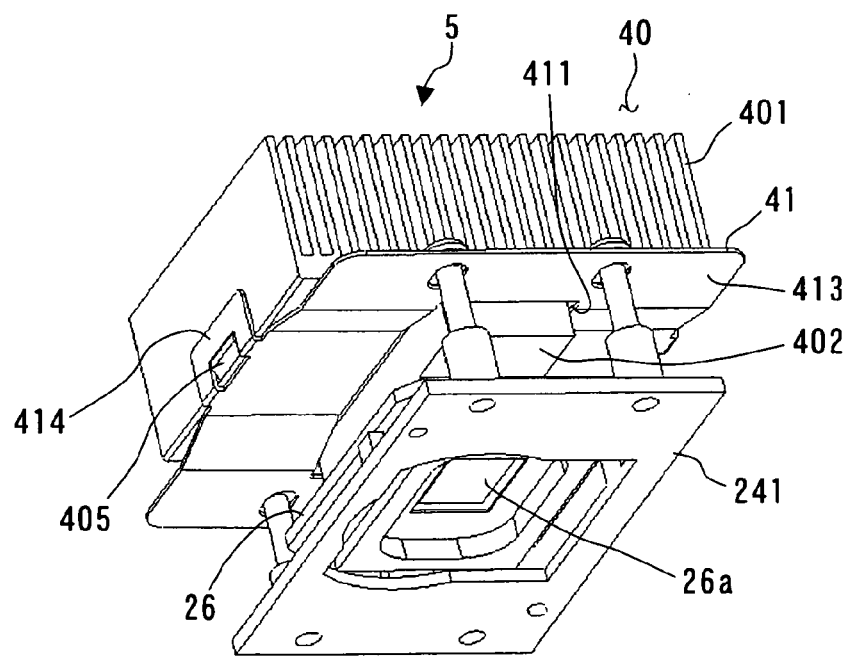
FIG. 7B is a second perspective view illustrating the cooling system according to the first embodiment of the present invention.

FIGS. 7A and 7B are external views of the cooling system 5. FIG. 7A is a perspective view of the cooling system 5, looking from above, and FIG. 7B is a perspective view of the cooling system 5, looking from below. In addition, the reinforcing plate 42 and the DMD case 262 are omitted in FIGS. 7A and 7B for convenience.

As illustrated in FIG. 7A, the supporting member 41 and the fixing member 241 are fixed by combining the attaching portion 413 of the supporting member 41 and the boss portions 241a of the fixing member 241 with screws.

Further, the supporting member 41 and the radiating member 40 are fixed by latching the latching portion 414 of the supporting member 41 with the latching projection 405 of the radiating member 40 with each other.

Furthermore, as illustrated in FIG. 7B, the convex-shaped heat-receiving portion 402 provided in the radiating member 40 is thermally connected to the heat-generating face 26b located at a rear face of the reflection-type display device 26 penetrating through the opening 411 of the supporting member 41.

Figure 8:
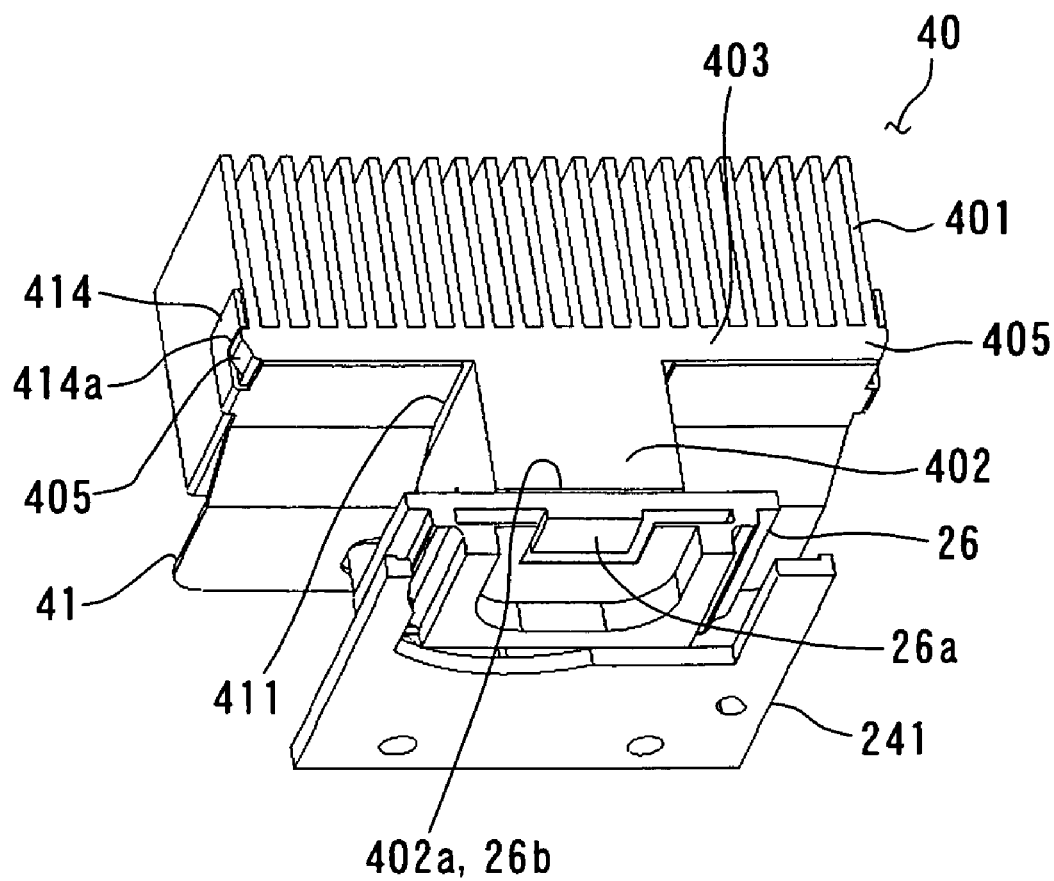
FIG. 8 is a perspective view illustrating the cooling system in FIG. 7A, looking from the direction of the Y-axis.

FIG. 8 is a cross-sectional perspective view of the cooling system 5 in FIG. 7A, divided at the Y-axis in FIG. 7A.

As illustrated in FIG. 8, an end of the heat-receiving portion 402 formed of a convex shape provided in the radiating member 40 serves as the heat-receiving face 402a, and the heat-generating face 26b of the reflection-type display device 26 and the heat-receiving face 402a are in contact with each other through thermally conductive grease and/or a thermally conductive sheet (not shown), or the like. Therefore, thermal connection between the heat-receiving face 402a and the heat-generating face 26b is thereby secured.

The heat received by the heat-receiving face 402a of the radiating member 40 is transferred through the convex-shaped heat-receiving portion 402 and the base 403 of the radiating member 40, and then reaches the surface of the numerous radiating fins 401. The cooling air flows along the surface of the numerous radiating fins 401, and the heat in the heat-generating face 26b of the reflection-type display device 26 is sequentially dissipated by exchanging the heat with the radiating fins 401.

Further, as illustrated in FIG. 8, the radiating member 40 and the supporting member 41 are fixed by latching the latching projection 405 provided at both ends of the base 403 of the radiating member 40 and the latching hole 414a of each of the latching portions 414 provided in the supporting member 41 with each other.

Each of the latching projections 405 is formed to be sloped, as illustrated in FIG. 8. Therefore, when the radiating member 40 is inserted into the supporting member 41 from above, both the latching portions 414 of the supporting member 41 are expanded by the slopes provided in the latching projections 405 toward right and left by elastic deformation, and when both the latching projections 405 are completely fitted into the latching holes 414a, the shape of the expanded latching portions 414 automatically returns to the original shape. Thus, the radiating member 40 and the supporting member 41 can be fixed by means of the slope shape provided in the latching projection 405 by a simple one-push operation, and the radiating member 40 and the supporting member 41 can easily and immediately be assembled.

Figure 9:
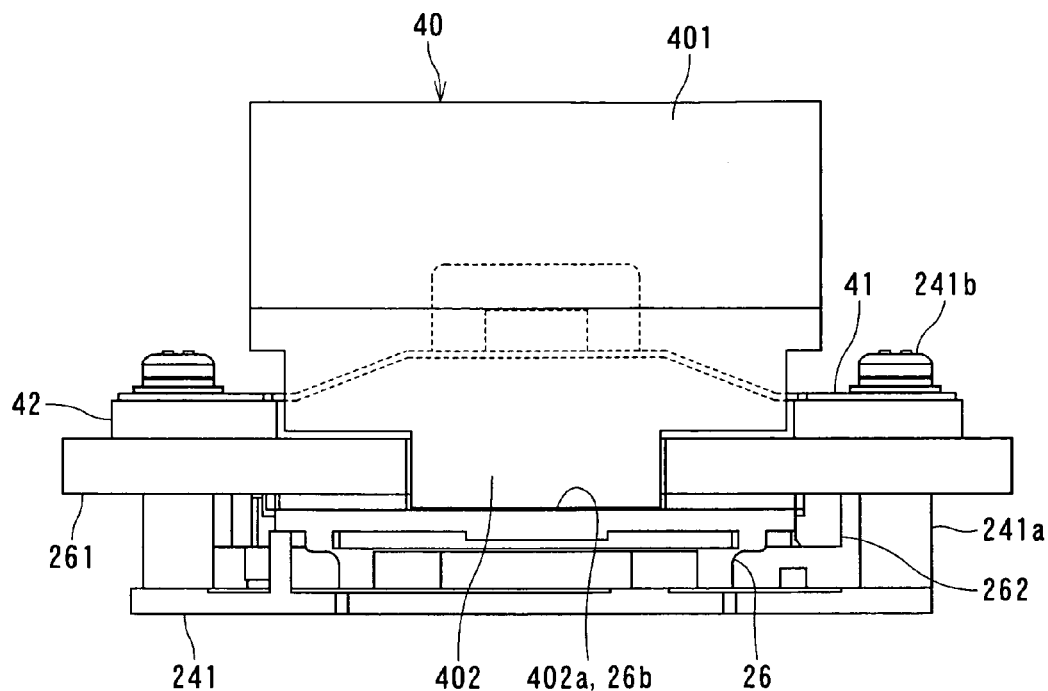
FIG. 9 is an X-axis cross-section illustrating the cooling system in FIG. 7A.

FIG. 9 is an x-axis cross-section of the cooling system 5 in FIG. 7A.

In FIG. 9, the reinforcing plate 42, the printed circuit board 261, and the DMD case 262, all of which are omitted in FIGS. 7A and 7B, are also shown.

As is clear from FIG. 9, the convex-shaped heat-receiving portion 402 that is provided in the radiating member 40 penetrates through each of the openings of the reinforcing plate 42, the printed circuit board 261, and the DMD case 262, and as a result, the heat-receiving face 402a of the heat-receiving portion 402 and the heat-generating face 26b of the reflection-type display device 26 securely contact each other.

In addition, the heat-receiving face 402a of the heat-receiving portion 402 and the heat-generating face 26b of the reflection-type display device 26 are pressed to each other by pressure that is produced by appropriate elasticity of the supporting member 41.

Figure 10:
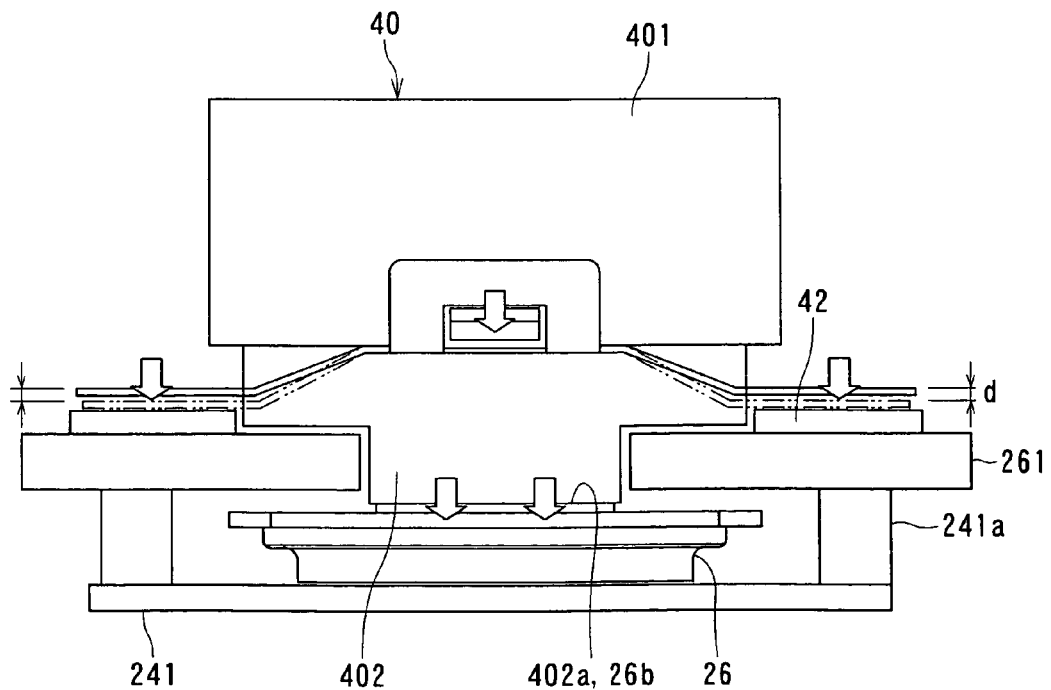
FIG. 10 is a cross-section illustrating the effect of an elastic force of a supporting member of the cooling system according to the first embodiment of the present invention.

In FIG. 10, two states of the supporting member 41 are illustrated, namely, the state before the supporting member 41 is fixed by the fixing screws 241b is illustrated by a solid line and another state of the supporting member 41, i.e., the state when the supporting member 41 is fixed by the fixing screws 241b, is illustrated by a two-dot chain line.

As illustrated in FIG. 10, the dimensional relationship between each of the components of the cooling system 5 is configured such that the attaching portion 413 of the supporting member 41 and the reinforcing plate 42 have a predetermined clearance d therebetween, before the fixing screws 241b are screwed into the boss portions 241a of the fixing member 241. When the fixing screws 241b are screwed into the boss portions 241a of the fixing member 241, the attaching portion 413 of the supporting member 41 and the reinforcing plate 42 are closely fixed, and at the same time, the supporting member 41 is elastically deformed. As a result, pressure in a downward direction indicated by arrows in FIG. 10 is produced by an elastic force produced by the elastic deformation. By this pressure, the heat-receiving face 402a of the radiating member 40 and the heat-generating face 26b of the reflection-type display device 26 are appropriately pressed to each other via thermally conductive grease and/or a thermally conductive sheet, or the like and the heat transfer performance is thereby improved, and a high cooling efficiency can be realized.

Further, the dimensions of each of the components of the cooling system 5 may include a certain manufacturing error and accordingly, the distance between a face of the reinforcing plate 42 to be attached and the heat-generating face 26*b* of the reflection-type display device 26 is not always constant. In the event that the manufacturing error occurs, it can be absorbed by the elasticity of the supporting member 41 and accordingly, a required time for assembling and for correcting the manufacturing error or the like can be reduced and workability is thereby improved.

As described above, according to the first embodiment of the cooling system 5, the supporting member 41 supports the radiating member 40 from the bottom face 403*a* of the base 403. On the contrary, as in the configuration described in the related art, when a radiating member is fixed from above radiating fins using an appropriate supporting member, the shape of the radiating fins 401 or the like is affected by the supporting member, and the resultant cooling performance to be partially sacrificed.

However, according to the first embodiment of the present invention, the radiating member 40 does not have any structural influence on the shape of the radiating fins 401.

Therefore, the heat exchange area of the radiating fins 401 is not reduced and the reflection-type display device 26 that serves as a heat-generating element can be cooled with high cooling efficiency.

Furthermore, because there is no supporting member 41 in proximity to the air flow path 50 for cooling the radiating fins 401, the air resistance of the air flow path 50 is not increased. As a result, the reflection-type display device 26 that serves as the heat-generating element can be cooled with high cooling efficiency.

Still further, by utilizing the elasticity of the supporting member 41, the heat-receiving face 402*a* of the radiating member 40 and the heat-generating face 26*b* of the reflection-type display device 26 are pressed by the appropriate pressure produced by the elastic deformation. As a result, high thermal conductivity is secured and the cooling efficiency is thereby improved.

Furthermore, the workability is improved because the manufacturing error is absorbed by the elasticity of the supporting member 41.

In addition, because the latching projection 405 of the radiating member 40 is formed with a slope, the radiating member 40 and the supporting member 41 can be combined with a simple one-push operation. As a result, when the radiating member 40 and the supporting member 41 are combined, the workability is further improved.

(8) Second Embodiment

Figure 11:
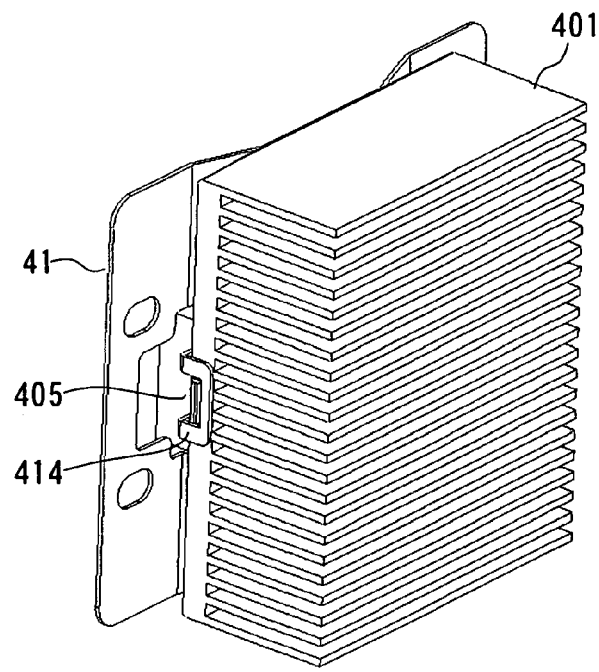
FIG. 11 is an external view of a radiating member of the cooling system according to the second embodiment of the present invention.

FIG. 11 illustrates a second embodiment of the cooling system 5.

Figure 12:
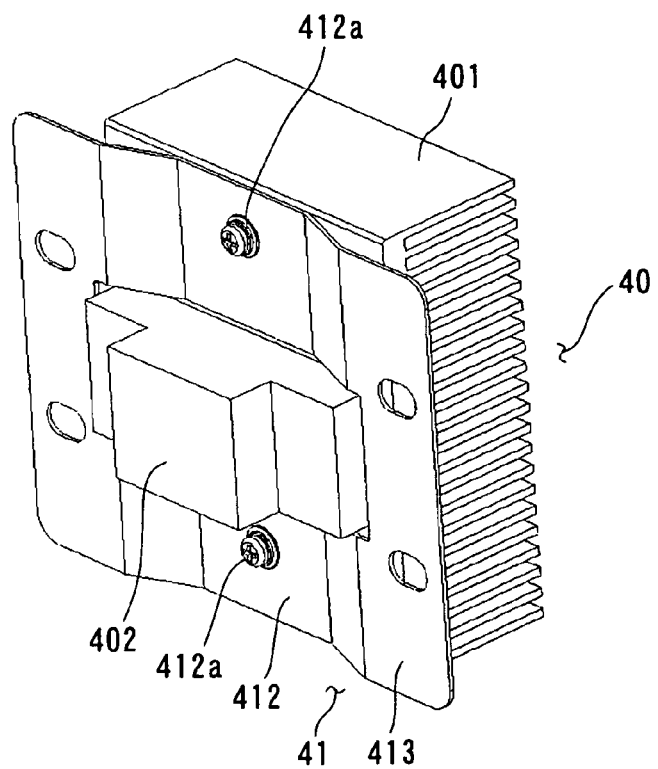
FIG. 12 is an external view of a radiating member of the cooling system according to the third embodiment of the present invention.

According to the first embodiment of the present invention, the positions of the latching projection 405 and the latching portion 414 are configured to be located at both the upper end and the lower end of the supporting member 41 in FIG. 12. However, in the second embodiment of the present invention, the latching projection 405 and the latching portion 414 are provided at both a left end and a right end of the supporting member 41 in FIG. 12.

Even in the configuration mentioned above, the supporting member 41 can support the radiating member 40 without affecting the radiating fins 401.

According to the second embodiment, even when a duct or the like adjoins very close to, for example, both ends of the radiating fins 401, the latching projection 405 and the latching portion 414 are not obstacles and therefore, there is enough space to perform the mounting operation.

(9) Third Embodiment

FIG. 12 illustrates a third embodiment of the cooling system 5.

In the third embodiment, the base 403 of the radiating member 40 and the supporting portion 412 of the supporting member 41 are combined by two fixing screws 412*a* (hereinafter, this operation is referred to as screw-fixing engagement) instead of the latching engagement using the latching holes 414*a* of the latching portion 414 and the latching projections 405.

Even though the screw-fixing combination is employed, the fact remains that the radiating member 40 is supported from the bottom face 403*a* of the base 403, and because the radiating fins 401 are not affected, high cooling efficiency can be secured.

According to the third embodiment of the present invention, even though advantage of the simple one-push operation in the latching engagement of the first embodiment is lost, the screw-fixing engagement is advantageous in an environment that requires stronger engagement of the supporting member 41 and the radiating member 40.

(10) Fourth Embodiment

In the fourth embodiment of the present invention, a cooling system 5A is composed of a radiating member 40A and a supporting member 41A. The configuration is that the radiating member 40 (as the radiating member 40A) and the supporting member 41 (as supporting member 41A) are picked up from the components of the cooling system 5 of the first embodiment, and in addition, the reinforcing plate 42 (as the reinforcing plate 42A) may be added to the two components mentioned above.

Figure 13:
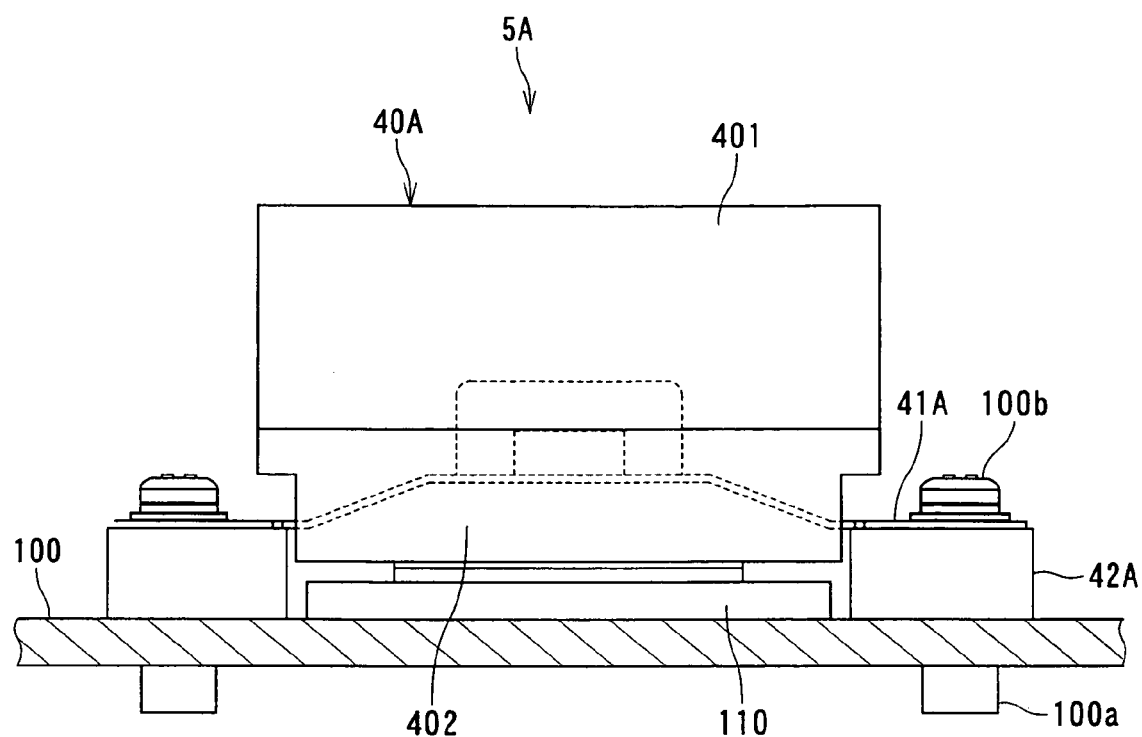
FIG. 13 is a cross-section illustrating a mounted cooling system according to the fourth embodiment of the present invention.

In the fourth embodiment, the heat-generating element that serves as a cooling object is not limited to the reflection-type display device 26. As illustrated in FIG. 13, the heat-generating element may be, for example, a CPU 110 that is mounted on a printed circuit board 100. The supporting member 41A and the printed circuit board 100 are combined by fixing a boss portion 100*a* provided in the printed circuit board 100 and a fixing screw 100*b* through the reinforcing plate 42A into a single body.

The thickness of the convex shape of the heat-receiving portion 402 that is provided in the radiating member 40A may be determined such that the heat-receiving face 402*a* of the radiating member 40A and the heat-generating face 110*a* of the CPU 110 are appropriately connected.

Further, the shape and area of the heat-receiving face 402*a* of the radiating member 40A may be formed such that the heat-generating face 110*a* of the CPU 110 is covered with the heat-receiving face 402*a*.

In the fourth embodiment, the supporting member 41A also supports the radiating member 40A from the bottom face 403*a* of the base 403 provided in the radiating member 40A, similar to the first embodiment. Therefore, the supporting member 41A does not structurally affect the radiating fins 401. In other words, for example, the heat exchange area of the radiating fins 401 is not reduced by the supporting member 41A. Further, the supporting member 41A does not have a negative effect on the cooling air, such as increasing the air resistance of the flowing path and the like. Accordingly, in contrast to the configuration of the cooling system in the related art, in which the radiating member is fixed to a cooling object by the supporting member from above the radiating fins, the cooling system according to the fourth embodiment of the present invention is designed to have higher cooling efficiency.

Furthermore, similar to the first embodiment of the present invention, the heat-generating face 110a of the CPU and the heat-receiving face 402a of the radiating member 40A are secured to be thermally connected by the elasticity of the supporting member 41A and the cooling efficiency is thereby improved. In addition, the manufacturing error in the dimensions of the components of the cooling system 5A can be absorbed by the elasticity of the supporting member 41A and the workability is thereby improved.

More over, similar to the first embodiment, the supporting member 41A and the radiating member 40A are fixed by a simple one-push operation and the assembly efficiency is thereby improved.

What is claimed is:

1. A cooling system comprising:
 a radiating member provided with a two-stepped heat-receiving projection portion thermally connected to a heat-generating element mounted on a printed circuit board;
 a supporting member provided with an opening penetrating the heat-receiving projection portion, and a supporting portion for supporting the radiating member; and
 a reinforcing plate having an opening portion penetrating the heat-receiving projection portion, the reinforcing plate being provided between the supporrting member and the printed circuit board,
 wherein the radiating member is integrally formed of a plurality of radiating fins, a base for supporting and fixing the plurality of radiating fins at one side thereof, and the heat-receiving projection portion disposed at a bottom face of the base, and wherein the supporting member supports the radiating member from a bottom face of the base.

2. The cooling system according to claim 1, wherein the supporting member is fixed to a fixing member provided outside through the printed circuit board.

3. The cooling system according to claim 1, wherein the supporting member is fixed by a screw to a boss portion of a fixing member provided outside through the printed ciicuit board.

4. The cooling system according to claim 1, further comprising:
 a mounting member for fixing the heat-generating element by pressing a peripheral part of the heat-generating element toward the printed circuit board.

5. The cooling system according to claim 1, wherein the supporting member is provided with a plate-shaped latching portion having a latching hole disposed at both ends of the supporting member facing each other, and wherein the radiating member is supported by latching a projection disposed at both side faces of the base of the radiating member facing each other with the latching hole.

6. The cooling system according to claim 1, wherein the supporting member is a plate-shaped member, and wherein the supporting member supports the radiating member by fixing the supporting member onto the bottom face of the base by a screw.

7. The cooling system according to claim 1, wherein the supporting member is formed in a plate-shape capable of elastic deformation, and the heat-receiving projection portion and the heat-generating element are pressed towards each other by an elastic force produced by the supporting member to be fixed to a fixing member provided outside through the printed circuit board.

8. A cooling system comprising:
 a fixing member having a light opening for passing light from a light source;
 a display device provided with a reflecting face facing the light opening and reflecting the light;
 a printed circuit board on which the display device is mounted;
 a radiating member provided with a two-stepped heat-receiving projection portion thermally connected to a heat-generating face of the display device;
 a supporting member provided with an opening penetrating the heat-receiving projection portion and a supporting portion for supporting the radiating member; and
 a reinforcing plate having an opening portion for penetrating the heat-recieving projection portion, the reinforcing plate being provided between the supporting member and the tinted circuit board,
 wherein the radiating member is integrally formed of a plurality of radiating fins, a base for supporting and fixing the plurality of radiating fins at one side thereof, and the heat-receiving projection portion disposed at a bottom face of the base, and wherein the supporting member supports the radiating member from a bottom face of the base.

9. The cooling system according to claim 8, wherein the supporting member is fixed to the fixing member through the printed circuit board.

10. The cooling system according to claim 8, wherein the supporting member is fixed by a screw to a boss portion provided in the fixing member through the printed circuit board.

11. The cooling system according to claim 8, further comprising:
 a mounting member for fixing the display device by pressing a peripheral part of the display device toward the printed circuit board.

12. The cooling system according to claim 8, wherein the supporting member is provided with a plate-shaped latching, portion having a latching hole disposed at both ends of the supporting member facing each other, and wherein the radiating member is supported by latching a projection disposed at both side faces of the base of the radiating member facing each other with the latching hole.

13. The cooling system according to claim 8, wherein the supporting member is a plate-shaped member, and wherein the supporting member supports the radiating member by fixing the supporting member onto the bottom face of the base by a screw.

14. The cooling system according to claim 8, wherein the supporting member is formed in a plate-shape capable of elastic deformation, and the heat-receiving projection portion and the heat-generating face of the display device are pressed towards each other by an elastic force produced by the supporting member to be fixed to the fixing member through the printed circuit board.

15. A projection-type image display apparatus comprising:
 a light source for generating light;
 a projection lens unit for projecting an image onto a screen provided outside;
 a fixing member having a light opening portion for passing the light from the light source;

a display device provided with a reflection face facing the light opening portion and reflecting the light;

a printed circuit board on which the display device is mounted;

a radiating member provided with a two-stepped heat receiving projection portion thermally connected to a heat-generating face of the display device;

a supporting member provided with a supporting portion for supporting the radiating member and an opening portion penetrating the heat-receiving portion; and a reinforcing plate having an opening portion penetrating the heat-recieving projection portion, the reinforcing plate being provided between the supporting member and the printed circuit board, wherein the radiating member is integrally formed of a plurality of radiating fins, a base for supporting and fixing the plurality of radiating fins at one side thereof, and the heat-receiving projection portion disposed at a bottom face of the base, and wherein the supporting member supports the radiating member from a bottom face of the base.

16. The projection-type image display apparatus according to claim 15, wherein the supporting member is fixed to the fixing member through the printed circuit board.

17. The projection-type image display apparatus according to claim 15, wherein the supporting member is fixed by a screw to a boss portion provided in the fixing member through the printed circuit board.

18. The projection-type image display apparatus according to claim 15, further comprising:

a mounting member for fixing the display device by pressing a peripheral part of the display device toward the printed circuit board.

19. The projection-type image display apparatus according to claim 15, wherein the supporting member is provided with a plate-shaped latching portion having a latching hole disposed at both ends of the supporting member facing each other, and wherein the radiating member is supported by latching a projection disposed at both side faces of the base of the radiating member facing each other with the latching hole.

20. The projection-type image display apparatus according to claim 15, wherein the supporting member is a plate-shaped member, and wherein the supporting member supports the radiating member by fixing the supporting member onto the bottom face of the base by a screw.

21. The projection-type image display apparatus according to claim 15, wherein the supporting member is formed in a plate-shape capable of elastic deformation, and the heat-receiving projection portion and the heat-generating face of the display device are pressed towards each other by an elastic force produced by the supporting member fixed to the fixing member through the printed circuit board.

* * * * *